United States Patent [19]
Gardner et al.

[11] Patent Number: 6,121,094
[45] Date of Patent: Sep. 19, 2000

[54] METHOD OF MAKING A SEMICONDUCTOR DEVICE WITH A MULTI-LEVEL GATE STRUCTURE

[75] Inventors: Mark I. Gardner, Cedar Creek; Mark C. Gilmer, Austin, both of Tex.

[73] Assignee: Advanced Micro Devices, Inc., Austin, Tex.

[21] Appl. No.: 09/120,246

[22] Filed: Jul. 21, 1998

[51] Int. Cl.⁷ ................................................. H01L 21/336
[52] U.S. Cl. .......................... 438/287; 438/50; 437/40; 437/189; 257/774
[58] Field of Search ..................... 438/287, 50; 437/189, 437/40; 257/774

[56] References Cited

U.S. PATENT DOCUMENTS

| | | | |
|---|---|---|---|
| 5,188,974 | 2/1993 | Mochizuki | 437/40 |
| 5,529,953 | 6/1996 | Shoda | 437/189 |
| 5,689,140 | 11/1997 | Shoda | 257/774 |

*Primary Examiner*—Richard Elms
*Assistant Examiner*—Pho Luu
*Attorney, Agent, or Firm*—Williams, Morgan & Amerson, P.C.

[57] ABSTRACT

The present invention is directed to a new semiconductor device and a method for making same. The semiconductor device is comprised of a gate dielectric layer, a conductor layer, and a metal oxide layer positioned between the gate dielectric layer and the conductor layer. The method comprises forming a gate dielectric layer, a conductor layer, and a metal oxide layer between the gate dielectric layer and the conductor layer.

21 Claims, 4 Drawing Sheets

METHOD OF MAKING A SEMICONDUCTOR DEVICE WITH A MULTI-LEVEL GATE STRUCTURE

BACKGROUND OF THE INVENTION

1. Field of the Invention

This invention is generally directed to semiconductor devices, and, more particularly, to a high performance semiconductor device.

2. Description of the Related Art

Generally speaking, there is a constant drive in the semiconductor industry to make semiconductor devices, i.e., transistors, smaller and smaller. All other things being equal, semiconductor devices with smaller feature sizes tend to be more efficient, i.e., faster, and may be more cost-effective to manufacture, in that a greater number of devices can be fabricated on a single wafer.

This constant drive to reduce the feature size of semiconductor devices has resulted in a corresponding scaling of many of the components of a semiconductor device. For example, as the gate length of semiconductor devices decreases, the thickness of the gate dielectric layer, i.e., the gate oxide layer, which has traditionally been made of silicon dioxide, also decreases. However, the reduction in the thickness of traditional silicon dioxide gate dielectric layers has resulted in several problems. For example, when silicon dioxide gate dielectric layers approach a thickness of approximately 20 Å, leakage of current from the conductor to the channel may increase. Additionally, it is difficult to fabricate silicon dioxide gate dielectric layers having a thickness of approximately 20 Å or less with the requisite quality required for gate dielectric layers.

Another problem may arise when a relatively thin silicon dioxide gate dielectric layer is used in a PMOS device. The gate electrode in PMOS devices is generally a doped polysilicon. Such doping is typically accomplished by the addition of boron to the polysilicon gate electrode layer. However, thin silicon dioxide gate dielectric layers, e.g., those having a thickness of approximately 20 Å or less, may not provide a sufficient barrier to prevent the migration of free boron atoms into the semiconductor substrate.

On the other hand, traditional gate oxide layers cannot be made too thick without adversely affecting the performance of the semiconductor devices. As is well known to those skilled in the art, the thickness of traditional gate oxide layers is tightly controlled to assure that the gate oxide layer is thin enough that an appropriate current can be induced in the gate region of a device by applying the appropriate voltage to a conductor above the gate oxide layer. Thus, as the feature size of semiconductor devices continues to decrease, there is a need to produce semiconductor devices having a gate dielectric layer that is dielectrically equivalent to a silicon dioxide gate layer having a thickness below approximately 20 Å.

Additionally, with semiconductor devices having certain types of metal conductor layers, e.g., tungsten, problems have arisen, in that the tungsten conductor layer does not adhere well to underlying process layers. This lack of adhesion can cause numerous problems, such as delaminations, and flaking of all or a portion of the conductor layer, etc. Depending on the severity of the types of problems caused by this lack of adhesion, semiconductor devices may be less efficient or rendered useless entirely.

The present invention is directed to a semiconductor device that solves some or all of the aforementioned problems and a method for making same.

SUMMARY OF THE INVENTION

The present invention is directed to a new semiconductor device and a method for making same. The semiconductor device is comprised of a substrate having a dielectric layer positioned above the surface of the substrate. The device also comprises a conductor layer positioned above the gate dielectric layer and a metal oxide layer positioned between the gate dielectric layer and the conductor layer. The device further comprises at least one source/drain region formed in the substrate.

The present inventive method comprises forming a gate dielectric layer above the surface of the substrate and forming a gate conductor layer above the gate dielectric layer. The method also comprises forming a metal oxide layer between the gate dielectric layer and the conductor layer. The method further comprises forming at least one source/drain region in the substrate.

BRIEF DESCRIPTION OF THE DRAWINGS

The invention may be understood by reference to the following description taken in conjunction with the accompanying drawings, in which like reference numerals identify like elements, and in which.

Figure 1:
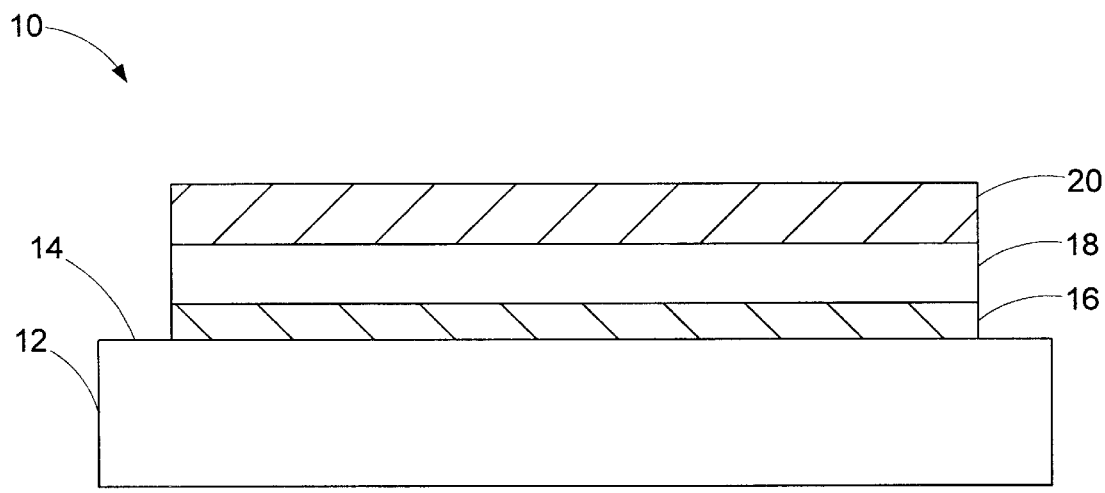
FIG. 1 is a cross-sectional schematic of a partially formed semiconductor device having a gate barrier layer, a gate dielectric layer and an initial metal layer formed above a substrate.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to FIGS. 1–7. Although the various regions and structures of a semiconductor device are depicted in the drawings as having very precise, sharp configurations and profiles, those skilled in the art recognize that, in reality, these regions and structures are not as precise as indicated in the drawings, e.g., the regions may have rounded edges. Additionally, the relative size of the features shown in the drawings may be exaggerated or reduced. Nevertheless, the attached drawings are included to provide an illustrative example of the present invention.

As shown in FIG. 1, a semiconductor device 10 may be comprised of a semiconductor substrate 12, a gate barrier layer 16, a gate dielectric layer 18, and an initial metal layer 20. The gate barrier layer 16 is initially formed above a surface 14 of the substrate 12. Next, the gate dielectric layer 18 is formed above the gate barrier layer 16. Thereafter, the initial metal layer 20 is formed above the gate dielectric layer 18.

Although not required to practice the present invention, the gate barrier layer 16 may be formed above the substrate 12 to prevent the migration of undesirable elements from, for example, the gate dielectric layer 18, into the substrate 12. For example, these undesirable elements could include titanium, barium, etc. The gate barrier layer 16 may be formed from a variety of materials, such as, silicon nitride or diamond, etc. Additionally, the gate barrier layer 16 may be formed using a variety of processes, including, but not limited to a remote plasma nitride process or a jet nitride deposition process. The gate barrier layer 16 may also be formed using the method and apparatus disclosed in our co-pending application entitled "Jet Vapor Reduction of the Thickness of Process Layers," Ser. No. 09/120,056 now pending, filed Jul. 21, 1998, which is hereby incorporated by reference in its entirety.

In one illustrative embodiment, the gate barrier layer 16 may be a layer of gate quality silicon nitride that may range in thickness from approximately 6–10 Å, and, in one illustrative embodiment, is approximately 6 Å thick. Of course, the material selected for the gate barrier layer 16, as well as the thickness of the gate barrier layer 16, is a matter of design choice that may vary depending on a variety of factors, such as, for example, the type of material selected to form the gate dielectric layer 18. For example, the gate barrier layer 16 could be made of oxynitride. However, for equivalent thicknesses, a layer of oxynitride may be a less effective barrier layer than a comparable layer of silicon nitride. Generally, it is desirable that the gate barrier layer 16 be as thin as practicable while still providing a sufficient barrier to prevent the migration of unwanted elements into the substrate 12.

The gate dielectric layer 18 is made from a material having a relatively high dielectric constant (the symbol for the dielectric constant of a material is "k"). In one illustrative embodiment of the present invention, the dielectric constant of the gate dielectric layer 18 ranges from approximately 25–500. A variety of materials may be used as the gate dielectric layer, including, for example, barium zirconium titanate ($BaZrTiO_3$), strontium titanate ($SrTiO_3$), tantalum pentoxide ($Ta_2O_5$), etc. The gate dielectric layer 18 could, of course, be comprised of more than one material. Additionally, the gate dielectric layer 18 does not have to be formed above the gate barrier layer 16. That is, depending upon the particular application, the gate barrier layer 16 could be omitted and the gate dielectric layer 18 could be formed directly on the surface 14 of the substrate 12. The gate dielectric layer 18 may, of course, be formed by a variety of processes. For example, in one illustrative embodiment, the gate dielectric layer 18 may be comprised of barium zirconium titanate ($BaZrTiO_3$) that is formed by a deposition process, such as chemical vapor deposition. The process would involve using precursors such as $Zr(OC(CH_3)_3)_4$ for the barium zirconium titanate ($BaZrTiO_3$).

Figure 2:
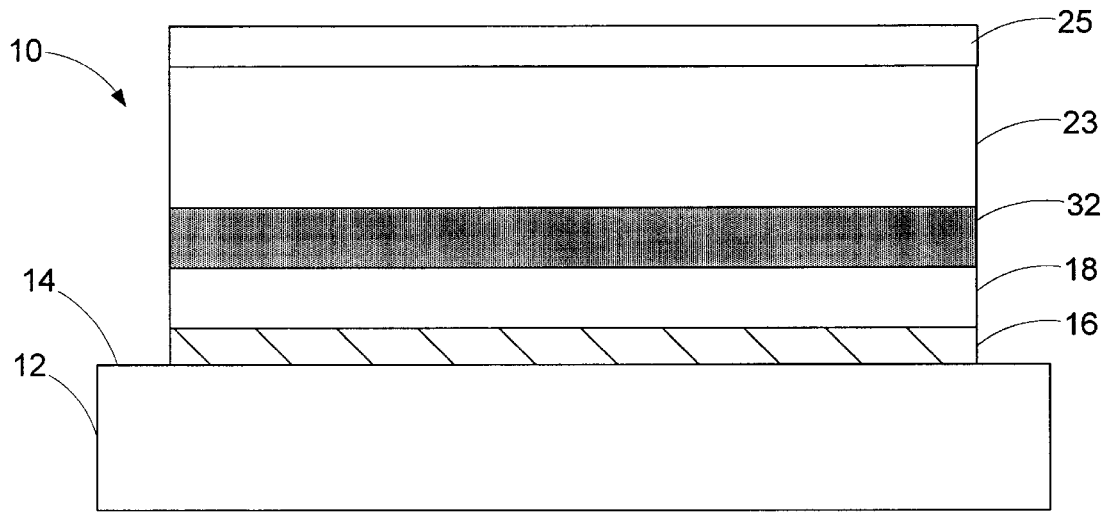
FIG. 2 is a cross-sectional schematic of a partially formed semiconductor device in which a conductor layer and a photoresist layer have been added to the device shown in FIG. 1.

In one embodiment of the present invention, the initial metal layer 20 is ultimately converted to a metal oxide layer 32 shown in FIG. 2. The initial metal layer 20 may be comprised of any of a variety of materials, such as tungsten, titanium, etc. In one illustrative embodiment of the present invention, the metal layer 20 is formed by, for example, depositing the initial metal layer 20, such as tungsten, above the gate dielectric layer 18, implanting oxygen ions into the initial metal layer 20 by, for example, an ion implantation process, and, thereafter, performing a heat treating process. The initial metal layer 20 may be comprised of tungsten and may range in thickness from approximately 100–300 Å. In one illustrative embodiment, the initial metal layer 20 may be comprised of a layer of tungsten approximately 200 Å thick. Thereafter, oxygen may be implanted into the initial metal layer 20 of, for example, tungsten, by a low energy ion implantation process. For example, oxygen may be implanted into the initial metal layer 20 at a concentration of $2\times10^{13}$ through $5\times10^{15}$ ions/cm$^2$ at an energy level of 100–600 eV. Ideally, this ion implantation process results in a peak concentration of the oxygen ions at approximately the middle of the metal oxide layer 32.

After the oxygen has been implanted into the initial metal layer 20, a heat treating step is performed in the presence of oxygen or a water vapor at a temperature ranging from 600–950° C. This heat treatment may be performed by a rapid thermal anneal process (lasting, for example, 10–60 seconds) or in a tube furnace (lasting, for example, 5–30 minutes). After the oxygen implantation and heat treating processes have been completed, the initial metal layer 20 has been transformed to a metal oxide layer 32 as shown in FIG. 2. In the illustrative embodiment discussed above, the initial metal layer 20 comprised of tungsten is converted into a metal oxide layer 32 comprised of tungsten trioxide ($WO_3$).

Figure 3:
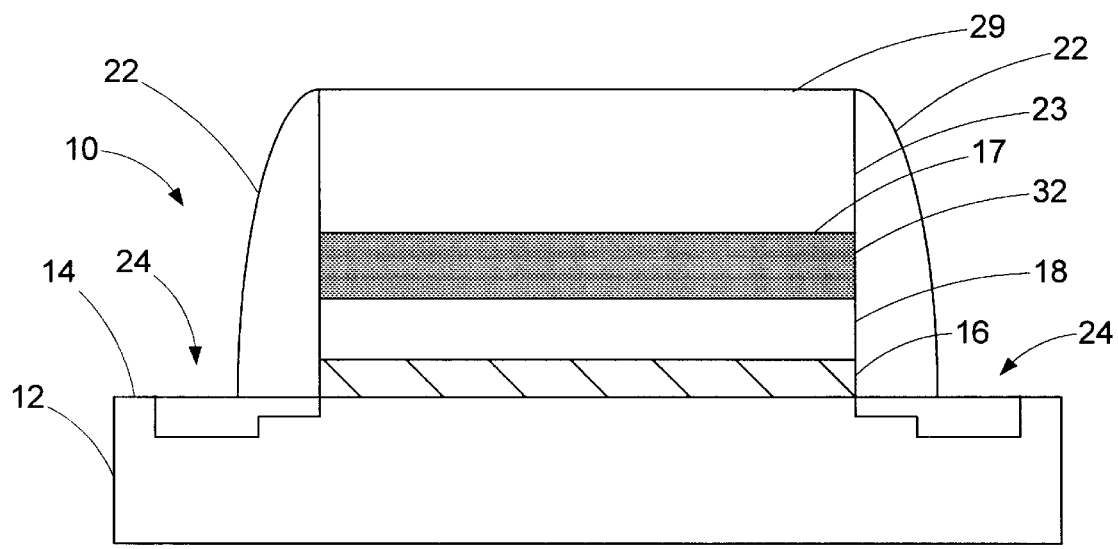
FIG. 3 is a cross-sectional schematic of a partially formed semiconductor device in which portions of the layers shown in FIG. 2 have been removed and a plurality of sidewall spacers have been formed adjacent the gate barrier layer, the gate dielectric layer, the metal oxide layer, and the conductor layer.

Thereafter, as shown in FIG. 2, a conductor layer 23 is formed over the metal oxide layer 32, and a photoresist layer 25 is formed above the conductor layer 23. As shown in FIG. 3, portions of the conductor layer 23, metal oxide layer 32, gate dielectric layer 18, and gate barrier layer 16 are removed. Thereafter, a plurality of sidewall spacers 22 are formed adjacent the gate barrier layer 16, gate dielectric layer 18, metal oxide layer 32, and the conductor layer 23. Additionally, a plurality of source/drain regions 24 may be formed in the substrate 12 before or after the formation of the sidewall spacers 22.

The conductor layer 23 may be comprised of a variety of materials, including, but not limited to, tungsten, titanium, tungsten nitride, polysilicon, etc. In one illustrative embodiment, the conductor layer 23 may be made of tungsten and may have a thickness of approximately 2000 Å. The conductor layer 23 may be formed above the metal oxide layer 32 and may be formed by a variety of processes. For example, the conductor layer 23 may be formed by a chemical vapor deposition process.

The removal of portions of the conductor layer 23, the metal oxide layer 32, the gate dielectric layer 18 and gate barrier layer 16 may be accomplished by a variety of processes and techniques. Moreover, the removal of portions of the layers 23, 32, 18, and 16 may be performed in single or multiple process steps. In one illustrative embodiment, an initial etching step may be used to remove portions of the conductor layer 23. If tungsten is selected as the material for the conductor layer 23, a plasma or reactive ion etching process using $WF_6$ as the etchant gases may be used to remove portions of the conductor layer 23. Thereafter, a second etching step may be used to remove portions of the metal oxide layer 32, the gate dielectric layer 18 and the gate barrier layer 16. The second etching step may be performed by, for example, reactive ion etching or plasma etching, using chlorine or fluorine as the etchant gases.

Thereafter, the sidewall spacers 22 may be formed adjacent the conductor layer 23, the metal oxide layer 32, the gate dielectric layer 18 and the gate barrier layer 16. One purpose of the sidewall spacers 22 is to provide a barrier to prevent the migration of unwanted elements from, for example, the metal oxide layer 32 or the gate dielectric layer 18, etc., into the substrate 12. In one embodiment of the present invention, the sidewall spacers 22 are formed of silicon nitride. Of course, other materials, such as oxynitride, may be used to form the sidewall spacers 22. However, as discussed above with respect to alternative materials for the gate barrier layer 16, it is desirable that any material selected provide sufficient protection to limit the migration of unwanted elements into the substrate 12, while at the same time not be overly thick. In one embodiment in which silicon nitride is used as the spacer material, the width of the sidewall spacers 22 at the surface 14 of the substrate 12 may vary from approximately 50–300 Å. The width of the sidewall spacers 22 may decrease at various heights above the surface 14 of the substrate 12. In one embodiment for sidewall spacers 22 made of silicon nitride, the sidewall spacers 22 may have a minimum thickness of at least approximately 50 Å for a distance extending at least 40 Å past the top surface 17 of the metal oxide layer 32.

The sidewalls spacers 22 may be formed by a variety of processes and techniques that may vary with the material selected for the sidewall spacers 22. For example, in one embodiment, the sidewalls spacers 22 are made of silicon nitride and formed by depositing a layer of silicon nitride above the surface 14 of the substrate 12 and onto at least a portion of the surface 29 of the conductor layer 23. Thereafter, an etching process, such as plasma etching, may be used to form the sidewall spacers 22 to the configuration shown in FIG. 3.

Those skilled in the art will recognize the source/drain regions 24 depicted in FIG. 3 have a traditional lightly doped drain (LDD) structure. If an LDD structure is to be used, the initial light doping of the source/drain regions 24 may be performed prior to the formation of the sidewall spacers 22. After the formation of the sidewall spacers 22, a second, heavy doping of the source/drain regions 24 could be performed to complete the formation of the LDD source/drain regions 24. However, the particular method of forming the source/drain regions 24 is not considered a limitation of the present invention.

Figure 4:
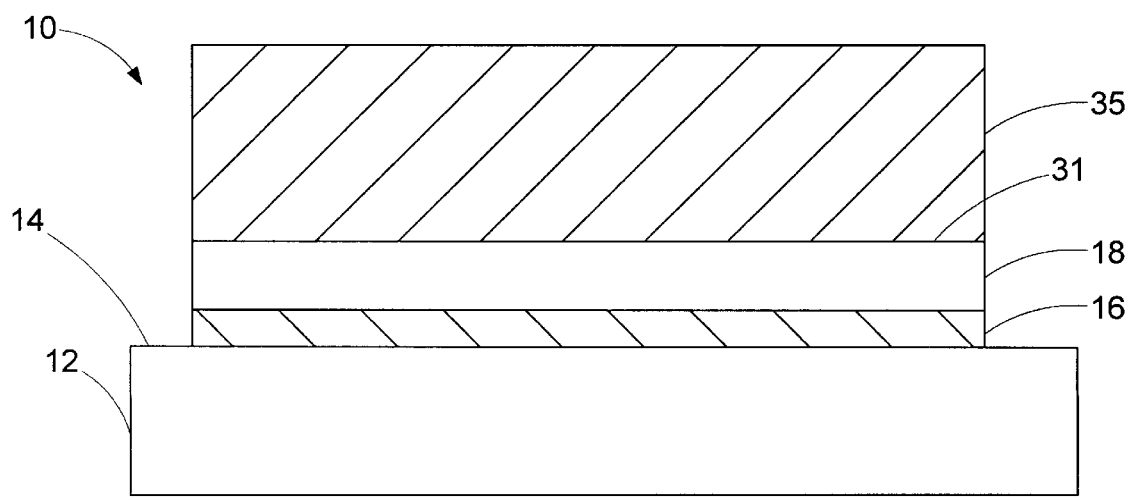
FIG. 4 is a cross-sectional schematic of a partially formed semiconductor device having a gate barrier layer, a gate dielectric layer, and a conductor layer formed above the substrate.
Figure 5:
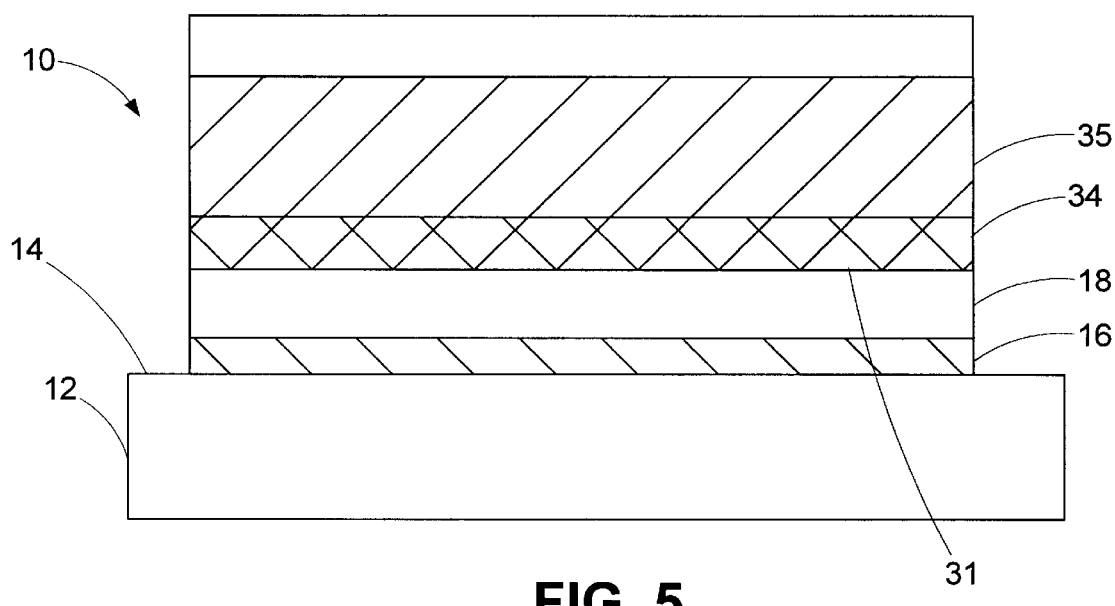
FIG. 5 is a cross-sectional view of the device shown in FIG. 4 after an oxygen rich layer has been formed between the gate dielectric layer and the conductor layer.

FIGS. 4–7 represent an alternative method for forming the semiconductor device 10 of the present invention. With reference to FIG. 4, a barrier layer 16 and gate dielectric layer 18 may be formed above the surface 14 of the substrate 12 as discussed above. Thereafter, a relatively thick conductor layer 35 is initially formed above the gate dielectric layer 18. As shown in FIG. 5, the conductor layer 23 may be subjected to a high energy oxygen implantation process at an energy level sufficient to form an oxygen rich portion 34 of the conductor layer 35 adjacent the gate dielectric layer 18. In one embodiment, the energy level of the ion implantation process is selected so as to be sufficient to drive the oxygen ions into a region extending from the surface 31 of the gate dielectric layer 18 to approximately 100–300 Å above the surface 31 of the gate dielectric layer 18. For example, oxygen may be implanted at a concentration of $2\times10^{13}$ through $5\times10^{15}$ ions/cm$^2$ at an energy level of approximately 1–6 keV. Those skilled in the art will recognize that, using the technique disclosed in FIGS. 1–3, a relatively thin initial metal layer 20 (having a thickness ranging from approximately 100–300 Å) is deposited above the gate dielectric layer 18, and, thereafter, subjected to a low energy (approximately 100–600 eV) oxygen implant step. In contrast, in the technique disclosed in FIGS. 4–6, a relatively thick conductor layer 35 (having a thickness of approximately 2100–2300 Å) is initially deposited above the gate dielectric layer 18 and, thereafter, subjected to a high energy (approximately 1–6 keV) oxygen implant step.

Figure 6:
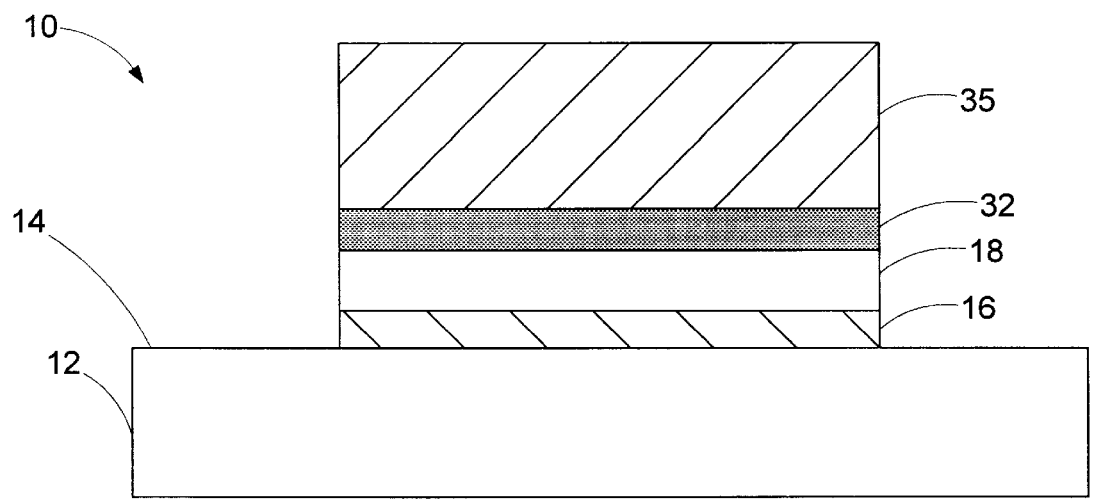
FIG. 6 is a cross-sectional schematic view of the device shown in FIG. 5 after the oxygen rich layer has been converted to a metal oxide layer.
Figure 7:
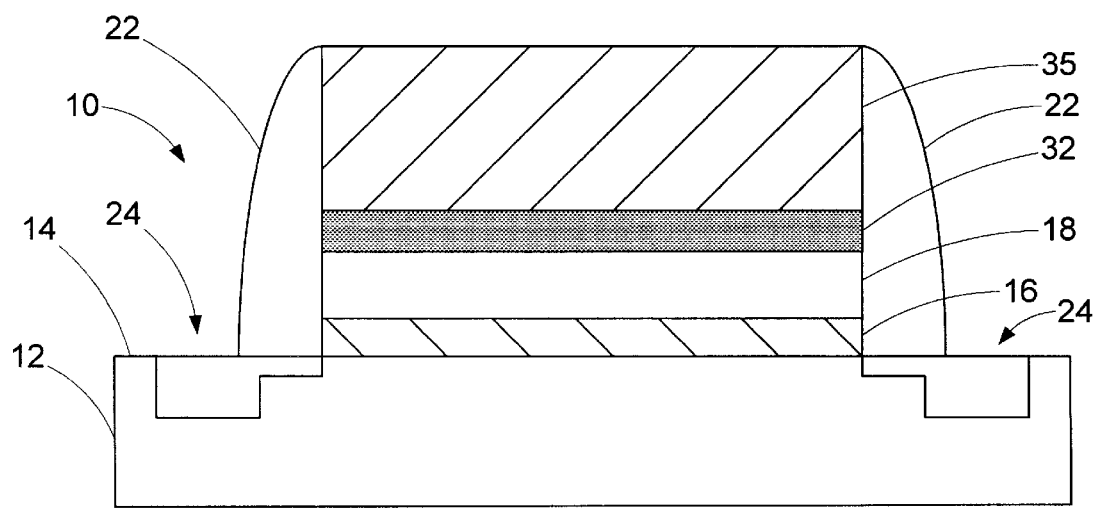
FIG. 7 is a cross-sectional view of a partially formed semiconductor device as shown in FIG. 5 further comprising a plurality of sidewall spacers formed adjacent the gate barrier layer, the gate dielectric layer, the metal oxide layer, and the conductor layer.

After the oxygen is implanted into the conductor layer 35 to form the oxygen rich portion 34, a heat treating process is carried out at approximately 700–950° C. to form a metal oxide layer 32 (as shown in FIG. 6) above the gate dielectric layer 18. This heat treatment may be performed by either a rapid thermal anneal process (for example, for 10–60 seconds) or carried out in a tube furnace (for example, for 5–30 minutes). As with the previous heat treating step, this process may be carried out immediately after the oxygen implantation process or may be delayed until some time later in the fabrication process. Of course, the time and temperature parameters may have to be varied. Thereafter, the sidewall spacers 22 and source and drain regions 24 may be formed, and further processing continued as discussed above with respect to the other embodiment of the present invention.

In one illustrative embodiment, the metal oxide layer 20, gate dielectric layer 18 and, if used, the gate barrier layer 16 are designed to collectively be dielectrically equivalent to a layer of approximately 6–15 Å of silicon dioxide having a dielectric constant of approximately 4. In one illustrative embodiment of the present invention, the gate barrier layer 16 may be comprised of an approximately 6 Å thick layer of silicon nitride (having a dielectric constant of approximately 8). The 6 Å layer of silicon nitride is approximately dielectrically equivalent to a 3 Å layer of silicon dioxide.

The thickness of the metal oxide layer 32 and the material used for the metal oxide layer 32 are matters of design choice that may vary depending upon specific application requirements or objectives. Additionally, the dielectric constant of the metal oxide layer 32 may vary, for example, from approximately 400–600. In one illustrative embodiment of the present invention, the metal oxide layer 32 is comprised of a layer of tungsten trioxide ($WO_3$) that may have a thickness ranging from approximately 100–300 Å. Tungsten trioxide has a dielectric constant of approximately 500. Therefore, in this illustrative embodiment, the metal oxide layer 32 would be dielectrically equivalent to approximately 1.6 Å of silicon dioxide. For ease of calculations, this may be rounded off to approximately 2 Å. Thus, for a semiconductor device designed to be dielectrically equivalent to 6–15 Å of silicon dioxide (k=4), the gate dielectric layer 18 may be designed to be dielectrically equivalent to approximately 1–10 Å of silicon dioxide. The dielectric constant of the gate dielectric layer 18 will vary depending upon the material selected. In one illustrative embodiment of the present invention, the dielectric constant of the gate dielectric layer 18 may vary from approximately 25–500. By way of example only, assuming that the gate dielectric layer 18 has a dielectric constant of 100, then the gate dielectric layer 18 would range in thickness from approximately 25–250 Å. However, if the gate barrier layer 16 is eliminated, and the metal oxide layer 32 is a layer of material having a dielectric constant of approximately 500 and a thickness of approximately 100–300 Å, then the gate dielectric layer 18 may range in thickness from approximately 25–2000 Å. Of course, these calculations are well known to those skilled in the art, and are only provided to illustrate how the thickness of the various layers may be determined.

The present invention provides a method for manufacturing semiconductor devices having gate structures that are dielectrically equivalent to silicon gate oxide layers having a thickness of approximately 6–15 Å. Thus, the device and method disclosed herein may be useful in achieving the reduced feature sizes desired in the manufacturing of modern semiconductor devices. Additionally, the present invention provides a method and device for insuring that metal conductor layers adhere properly to underlying process layers.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of manufacturing a semiconductor device above a substrate, said substrate having a surface, said method comprising:

forming a gate dielectric layer above said surface of said substrate;

forming an initial layer of metal above said gate dielectric layer;

implanting oxygen into said initial layer of metal;

heat treating at least said initial layer of metal at some time after said oxygen implantation process;

forming a conductor layer above said initial layer of metal;

forming at least one source/drain region;

removing a portion of said gate dielectric layer, said initial layer of metal, and said conductor layer; and forming a plurality of sidewall spacers adjacent at least said gate dielectric layer and said initial layer of metal.

2. The method of claim 1, further comprising forming a gate barrier layer between said gate dielectric layer and said surface of said substrate.

3. The method of claim 1, wherein implanting said oxygen into said initial layer of metal comprises ion implanting oxygen at a concentration of approximately $2\times10^{13}$–$5\times10^{15}$ ions/cm$^2$ at an energy level ranging from approximately 100–600 eV.

4. The method of claim 1, wherein said heat treating comprises heating at least said initial layer of metal to a temperature of approximately 600–950° C. in the presence of oxygen or a water vapor.

5. The method of claim 1, wherein heat treating at least said initial layer of metal at some time after said oxygen implantation process comprises heat treating at least said initial layer of metal at some time after said oxygen implantation process to form a metal oxide layer.

6. A method of manufacturing a semiconductor device above a substrate, said substrate having a surface, said method comprising:

forming a gate dielectric layer above the surface of said substrate;

forming an initial layer of metal above said gate dielectric layer;

implanting oxygen into said initial layer of metal;

heat treating said initial layer of metal;

forming a conductor layer above said initial layer of metal after said oxygen implantation process;

forming at least one source/drain region;

removing a portion of said gate dielectric layer, said initial metal of layer, and said conductor layer; and forming a plurality of sidewall spacers adjacent at least said gate dielectric layer and said initial metal layer.

7. The method of claim 6, further comprising forming a gate barrier layer between said gate dielectric layer and said surface of said substrate.

8. The method of claim 6, wherein implanting said oxygen into said initial layer of metal comprises ion implanting oxygen at a concentration of approximately $2\times10^{13}$–$5\times10^{15}$ ions/cm$^2$ at an energy level ranging from approximately 100–600 eV.

9. The method of claim 6, wherein said heat treating said initial layer of metal comprises heating said initial layer of metal to a temperature of approximately 600–950° C. in the presence of oxygen or a water vapor at some time after said oxygen implantation process has been completed.

10. The method of claim 6, wherein heat treating said initial layer of metal comprises heat treating said initial layer of metal to form a metal oxide layer.

11. A method of manufacturing a semiconductor device above a substrate, said substrate having a surface, said method comprising:

forming a gate dielectric layer above the surface of said substrate;

forming a conductor layer above said gate dielectric layer;

converting a portion of said conductor layer adjacent said gate dielectric layer into a metal oxide layer;

forming at least one source/drain region;

removing a portion of said gate dielectric layer, said metal oxide layer, and said conductor layer; and forming a plurality of sidewall spacers adjacent at least said gate dielectric layer and said metal oxide layer.

12. The method of claim 11, wherein converting a portion of said conductor layer adjacent said gate dielectric layer into a metal oxide layer comprises:

implanting oxygen into said conductor layer; and heat treating said conductor layer at some time after said oxygen implantation process.

13. The method of claim 12, wherein implanting said oxygen into said conductor layer comprises ion implanting oxygen at a concentration of approximately $2\times10^{13}$–$10^{15}$ ions/cm$^2$ at an energy level ranging from approximately 1–6 keV.

14. The method of claim 12, wherein heat treating said conductor layer comprises heating said conductor layer to a temperature of approximately 700–950° C. in the presence of oxygen or a water vapor.

15. A method of manufacturing a semiconductor device above a substrate, said substrate having a surface, said method comprising:

forming a gate dielectric layer above the surface of said substrate;

forming a conductor layer above said gate dielectric layer;

implanting oxygen into said conductor layer;

heat treating said conductor layer at some time after said oxygen implantation process;

forming at least one source/drain region;

removing a portion of said gate dielectric layer and said conductor layer; and forming a plurality of sidewall spacers adjacent at least said gate dielectric layer.

16. The method of claim 15, further comprising forming a gate barrier layer between said gate dielectric layer and said surface of said substrate.

17. The method of claim 15, wherein implanting oxygen into said conductor layer comprises ion implanting oxygen at a concentration of approximately $2 \times 10^{13} - 5 \times 10^{15}$ ions/cm$^2$ at an energy level ranging from approximately 1–6 keV.

18. The method of claim 15, wherein said heat treating comprises heating at least a portion of said conductor layer to a temperature of approximately 700–950° C. in the presence of oxygen or a water vapor.

19. The method of claim 15, wherein heat treating said conductor layer at some time after said oxygen implantation process comprises heat treating said conductor layer at some time after said oxygen implantation process to form a metal oxide layer.

20. A method of manufacturing a semiconductor device above a substrate, said substrate having a surface, said method comprising:

forming a gate dielectric layer above said surface of said substrate;

forming a gate conductor layer above said gate dielectric layer;

forming a portion of said conductor layer into a metal oxide layer between said gate dielectric layer and said gate conductor layer; and forming at least one source/drain region.

21. The method of claim 20, wherein said metal oxide layer is formed after the formation of the gate conductor layer.

* * * * *